(12) United States Patent
Kim

(10) Patent No.: US 6,998,002 B2
(45) Date of Patent: Feb. 14, 2006

(54) METHOD OF MANUFACTURING CERAMIC PACKAGE SEALING STRUCTURE AND CERAMIC PACKAGE HAVING SAID SEALING STRUCTURE

(75) Inventor: Yong Wook Kim, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 11/064,967

(22) Filed: Feb. 25, 2005

(65) Prior Publication Data

US 2005/0139990 A1    Jun. 30, 2005

Related U.S. Application Data

(62) Division of application No. 10/787,979, filed on Feb. 27, 2004, now Pat. No. 6,888,239.

(30) Foreign Application Priority Data

Nov. 3, 2003    (KR) .......................... 2003-0077296

(51) Int. Cl.
*H01L 33/00* (2006.01)

(52) U.S. Cl. .................................................. 156/89.12

(58) Field of Classification Search .............. 156/89.12
See application file for complete search history.

(56) References Cited

U.S. PATENT DOCUMENTS

| | | | |
|---|---|---|---|
| 4,656,499 A | 4/1987 | Butt | |
| 4,922,324 A | 5/1990 | Sudo | |
| 5,153,709 A | 10/1992 | Fukuoka | |
| 5,188,985 A | 2/1993 | Medeiros, et al. | |
| 5,218,230 A | 6/1993 | Tamamura et al. | |
| 5,804,870 A | 9/1998 | Burns | |
| 5,818,699 A | 10/1998 | Fukuoka | |
| 6,759,590 B1 | 7/2004 | Stark | |

*Primary Examiner*—Cathy F. Lam
(74) *Attorney, Agent, or Firm*—Lowe Hauptman & Berner, LLP

(57) ABSTRACT

The invention provides a ceramic package, a ceramic package having such a sealing structure and a fabrication method of thereof. In the ceramic package, a wall layer made of a plurality of laminated ceramic sheets and having a cavity formed in a central portion thereof is stacked on a top of a base layer made of a plurality of laminated ceramic sheets. A metal layer is coated on the wall layer around the cavity to expose an outer peripheral portion of the wall layer. A glass layer is coated on the outer peripheral portion of the wall layer, which is not coated with the metal layer, to contact with the metal layer. A lid is attached on the metal layer to seal the cavity. The glass layer is coated around the metal layer, which is attached on the ceramic wall layer around the cavity, to reinforce the bonding force between the metal layer and the underlying ceramic wall layer thereby potentially preventing creation of cracks between the metal layer and the underlying ceramic wall layer.

6 Claims, 4 Drawing Sheets

METHOD OF MANUFACTURING CERAMIC PACKAGE SEALING STRUCTURE AND CERAMIC PACKAGE HAVING SAID SEALING STRUCTURE

RELATED APPLICATIONS

The present application is a divisional of U.S. patent application Ser. No. 10/787,979, filed Feb. 27, 2004, now U.S. Pat. Ser. No. 6,888,239.

BACKGROUND OF THE INVENTION

1. Field of the Invention

The present invention relates to a ceramic package, and more particularly to a sealing structure in a ceramic package which has a glass layer coated around a metal layer, which is attached on a ceramic wall layer around a cavity, to reinforce the bonding force between the metal layer and the underlying ceramic wall layer thereby potentially preventing creation of cracks between the metal layer and the underlying ceramic wall layer. Further, the present invention relates to a ceramic package having such a sealing structure and a fabrication method of thereof.

2. Description of the Related Art

The fabrication technology of ceramic packages combined with the design technology of Radio Frequency (RF) devices has developed into a fundamental technology available for the development of communication components, and is being efficiently utilized to reduce the size, cost and weight of mobile communication elements as well as integrate the same.

All of those elements adopting the ceramic package fabrication technology have a laminated structure constituted of ceramic sheets of a predetermined thickness laminated one atop another and electrodes and metal patterns, which are formed on at least some of the ceramic sheets by applying metal paste containing Ag and/or Cu on the same according to RF device design, in order to realize electric, dielectric and magnetic properties of the communication elements. Further, in such a communication element having a ceramic package, electronic components such as Surface Acoustic Wave (SAW) filter, a Power Amplifier Module (PAM) and Integrated Circuit (IC) chips are installed within a cavity or internal space of the ceramic package to impart a multiple function to the communication element. In this circumstance, it is necessary to maintain the cavity of the ceramic package under a predetermined vacuum level to protect the electronic components installed in the cavity from the external environment so that the electronic components can operate normally.

FIG. 1 is a sectional view of a ceramic package of the conventional art, FIG. 2 is an enlargement of a part A in FIG. 1, and FIG. 3 is a plan view of FIG. 1.

Referring to FIGS. 1 to 3, a ceramic package 100 includes a base layer 102 made of a plurality of laminated ceramic sheets, a wall layer 104 made of a plurality of laminated ceramic sheets and a cavity 106, electronic components 108 such as an IC chip mounted within the cavity 106, a plurality of metal bumps 110 for fixing the electronic components 108 to the base layer 102, a metal electrode or metal layer 112 coated on a top of the wall layer 104, a lid 116 mounted on the metal layer 112 and a bonding layer 114 for attaching the lid 116 to the metal layer 112.

The lid 116 functions to protect the electronic components 108 installed in the cavity 106 from the external environment as well as to maintain the cavity 106 at a predetermined vacuum level. The lid 116 is made of Kovar, and attached to the metal layer 112 by the bonding layer 114 made of Au/Sn.

However, since the wall layer 104 is made of ceramic, in particular, Low Temperature Co-fired Ceramic (hereinafter will be referred to as 'LTCC') and the metal layer 112 is made of high conductive metal such as Ag, the wall layer 104 and the metal layer 112 are not firmly bonded with each other owing to different physical properties thereof. In particular, since the metal layer 112 forms a weak interface with the wall layer 104, the metal layer 112 tends to rise from the wall layer 104 at the interface to form a crack C as shown in FIG. 4.

If the metal layer 112 is raised (at least partially) from the wall layer 104 to form the crack C, outer air is introduced into the cavity 106 through the crack C creating so-called leak. Then, the vacuum level of the cavity 106 is lowered resultantly degrading the electronic components 108 mounted within the cavity 106.

Further, when the Au/Sn bonding layer 114 is interposed between the lid 116 and the metal layer 112 overlying the wall layer 104 to bond the lid 116 to the metal layer 112, it is difficult to precisely align the lid 116 with the metal layer 112.

SUMMARY OF THE INVENTION

The present invention has been made to solve the foregoing problems and it is therefore an object of the present invention to provide a sealing structure in a ceramic package which has a glass layer coated around a metal layer, which is attached on a ceramic wall layer around a cavity, to reinforce the bonding force between the metal layer and the underlying ceramic wall layer thereby potentially preventing creation of cracks between the metal layer and the underlying ceramic wall layer.

It is another object of the invention to form the ceramic layer around the metal layer so that a lid can be readily aligned with the metal layer when attached thereto.

According to an aspect of the invention for realizing the foregoing objects, there is provided a leak-free sealing structure in a ceramic package having a central cavity. The leak-free sealing structure comprises: a metal layer coated on a wall layer of the ceramic package around the cavity to expose an outer peripheral portion of the wall layer; a glass layer coated on the outer peripheral portion of the wall layer, which is not coated with the metal layer, to contact with the metal layer; and a lid attached on the metal layer to seal the cavity.

According to another aspect of the invention for realizing the foregoing objects, there is provided a leak-free ceramic package which comprises: a base layer made of a plurality of laminated ceramic sheets; a wall layer stacked on a top of the base layer, and made of a plurality of laminated ceramic sheets and a cavity formed in a central portion thereof; a metal layer coated on the wall layer around the cavity to expose an outer peripheral portion of the wall layer; a glass layer coated on the outer peripheral portion of the wall layer, which is not coated with the metal layer, to contact with the metal layer; and a lid attached on the metal layer to seal the cavity.

Both the sealing structure and the ceramic package may further comprise a bonding layer formed on the metal layer to bond the lid with the metal layer.

In the sealing structure and the ceramic package, the bonding layer is made of Au/Sn.

Preferably, the metal layer is made of Ag.

The metal layer is preferably treated with Pd and plated with Ni and Au.

Preferably, the lid is made of Kovar.

In the sealing structure and the ceramic package, the glass layer contains $SiO_2$ as a major component.

Preferably, the glass layer is screen printed, and co-fired at a temperature range of about 700 to 900° C.

The glass layer preferably covers a portion of the metal layer adjacent to an upper peripheral portion of the wall layer at a predetermined width, wherein the glass layer more preferably covers the metal layer at a width of about 50 to 200 μm.

According to further another aspect of the invention for realizing the foregoing objects, there is provided a method for fabricating a ceramic package having a cavity. The fabrication method comprises the following steps of: applying metal paste on a wall layer of the ceramic package to form a metal layer around the cavity; coating a glass layer on an interference between the wall layer and the metal layer; heat treating the ceramic package; plating the metal layer; mounting an electronic component within the cavity; and attaching a lid on the metal layer to seal the cavity.

In the method for fabricating a ceramic package, the step of attaching a lid forms a bonding layer on the metal layer to bond the lid with the metal layer via the bonding layer.

Preferably, the bonding layer is made of Au/Sn.

The step of attaching a lid is preferably carried out at a temperature of about 330° C. in a nitrogen atmosphere.

Preferably, the metal layer is made of Ag.

The lid is preferably made of Kovar.

Preferably, the glass layer contains $SiO_2$ as a major component.

Preferably, the step of heat treating bakes the ceramic package at a temperature of about 330° C. for about 21 hrs and fires the baked ceramic package at a temperature of about 830° C. for about 30 mins.

The glass layer preferably covers a portion of the metal layer adjacent to an upper peripheral portion of the wall layer at a predetermined width.

The method for fabricating a ceramic package may further comprise the step of treating the metal layer with Pd and plating the metal layer with Ni and Au.

Preferably, the plating step etches the metal plate with 2% HF for about 3 mins, treats the etched metal plate with Pd, plates the Pd-treated metal plate with Ni for about 30 mins and with Au for about 20 mins.

According to still another aspect of the invention for realizing the foregoing objects, there is provided a ceramic package which is obtained according to the above fabrication method.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Hereinafter a preferred embodiment of the invention will be described in detail with reference to the accompanying drawings.

Figure 1:
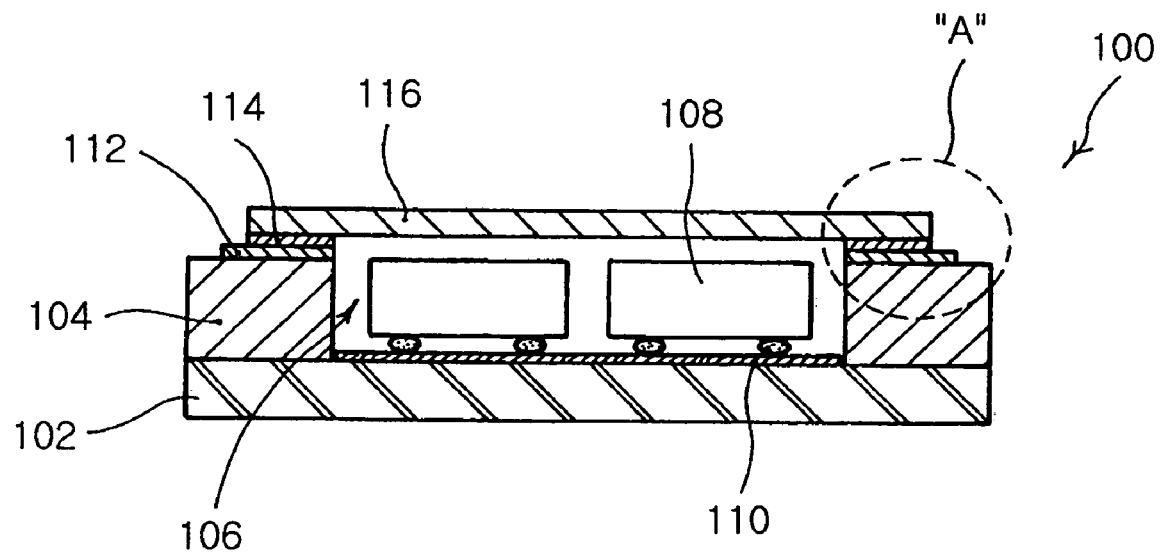
FIG. 1 is a sectional view of a ceramic package of the conventional art.
Figure 2:
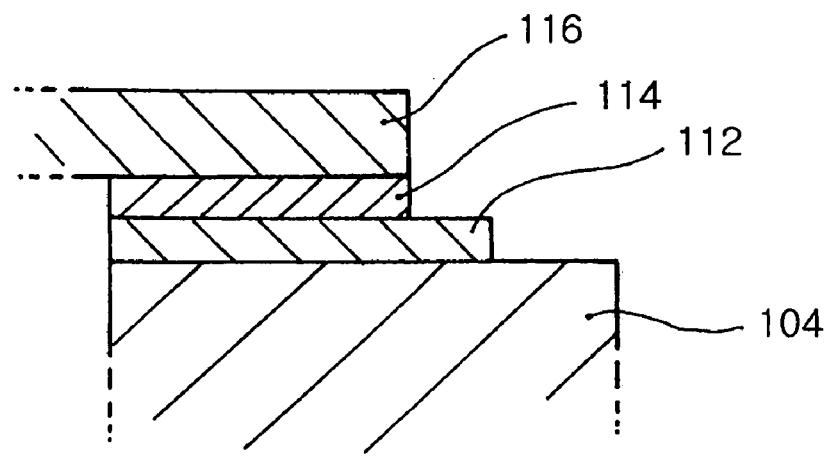
FIG. 2 is an enlargement of a part A in FIG. 1.
Figure 3:
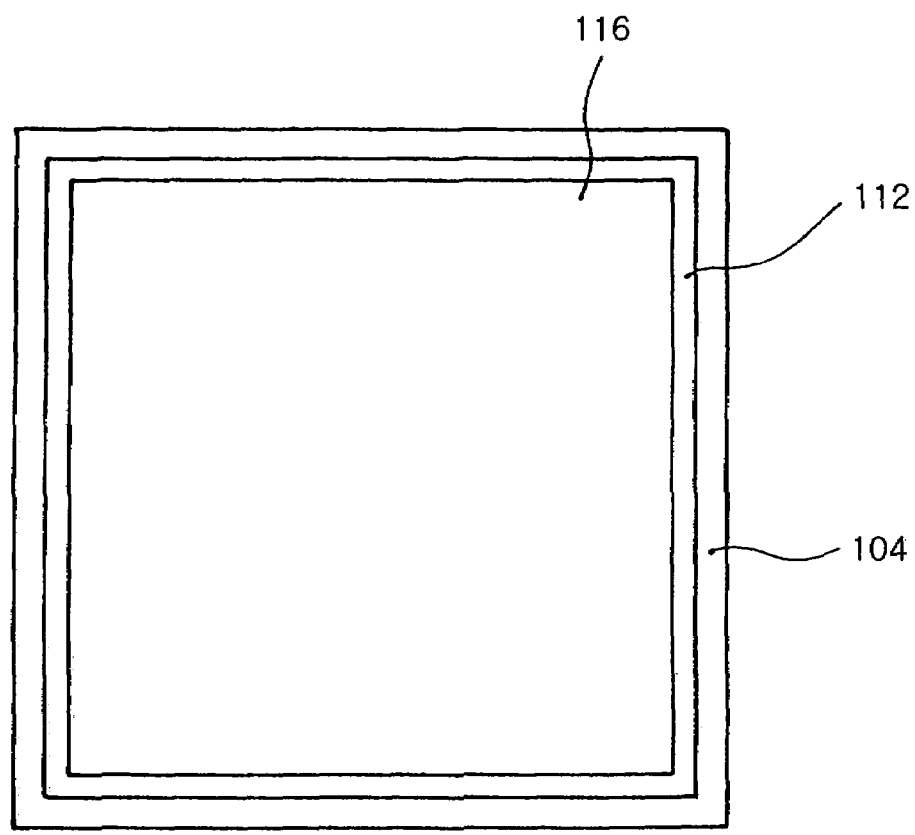
FIG. 3 is a plan view of FIG. 1.
Figure 5:
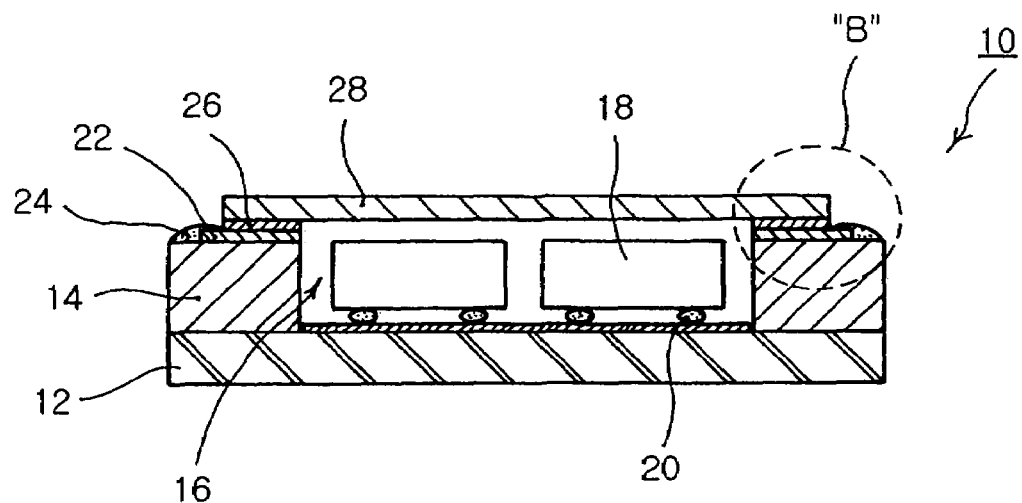
FIG. 5 is a sectional view of a ceramic package of the present invention.
Figure 6:
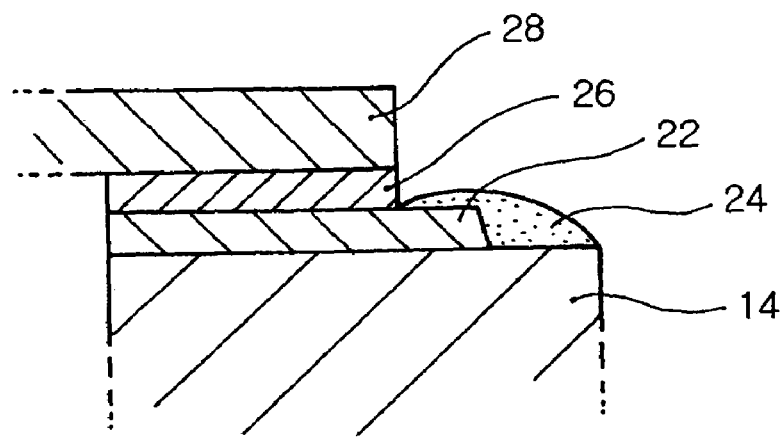
FIG. 6 is an enlargement of a part B in FIG. 6.
Figure 7:
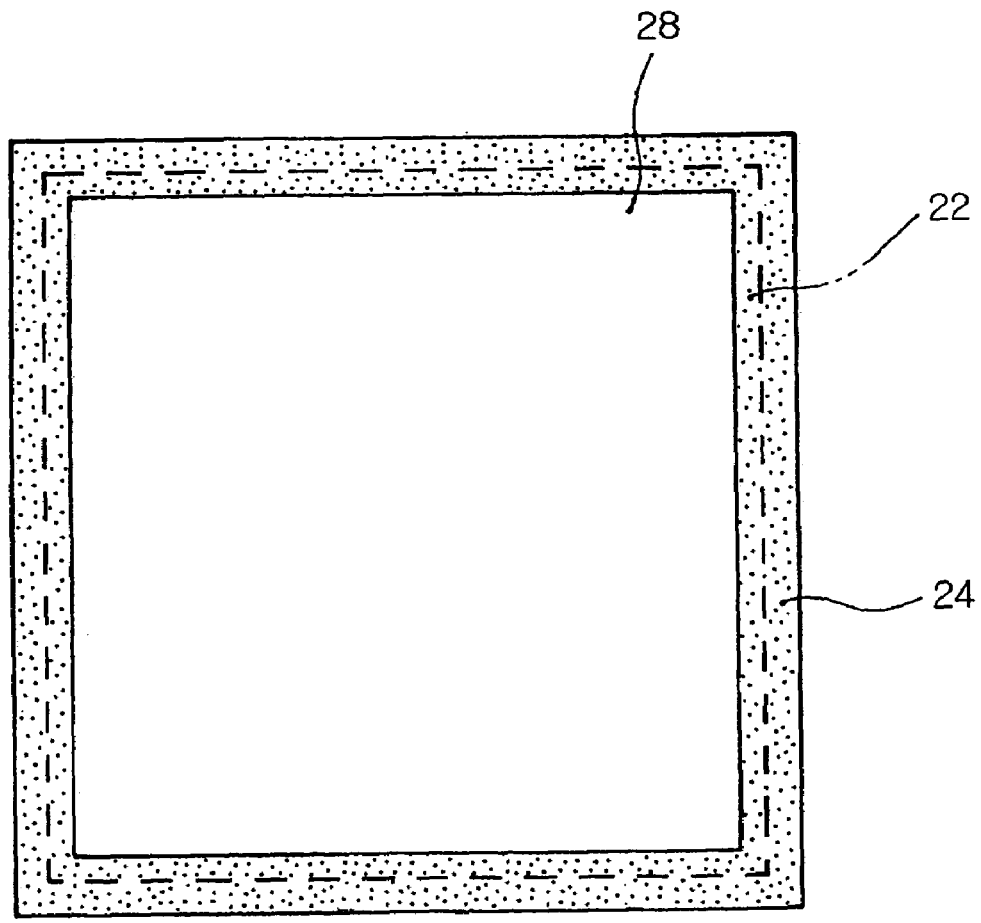
FIG. 7 is a plan view of FIG. 5.

FIG. 5 is a sectional view of a ceramic package of the present invention, FIG. 6 is an enlargement of a part B in FIG. 6, and FIG. 7 is a plan view of FIG. 5.

Referring to FIGS. 5 to 7, the ceramic package 10 of the present invention includes a base layer 12 made of a plurality of laminated ceramic sheets, a wall layer 14 overlying the base layer 12 and made of a plurality of laminated ceramic sheets and a cavity 16 formed in a central portion of the wall layer 14, a metal electrode or metal layer 22 coated on a top of the wall layer 14 around the cavity 16 in such a fashion to expose the periphery of the wall layer 14, a glass layer 24 coated on both an upper peripheral portion of the wall layer 14 which is not coated with the metal layer 22 and a portion of the metal layer 22 adjacent to the upper peripheral portion of the wall layer 14 and a lid 28 mounted on the metal layer 22 to seal the cavity 16.

Describing the ceramic package 10 in more detail, the base layer 12 is formed by pressing the laminated ceramic sheets together, and the wall layer 14 is formed by pressing the laminated ceramic sheets together and then stacked on a top of the base layer 12, forming the cavity 16. The laminated ceramic sheets of both the base and wall layers 14 are made of LTCC.

Electronic components 18 such as IC chips mounted within the cavity 16 are fixed to the base layer 12 by metal bumps 20, and electrically connected with internal electrodes of the base layer 12.

In the meantime, the metal layer 22 is formed on the top of the wall layer 14 along the periphery of the cavity 16 via screen printing. The metal layer 22 is formed by screen printing metal paste such as Ag having excellent electric conductivity on the wall layer 14, and then treated with Pd and plated with Ni and Au.

The glass layer 24 coated on the outer periphery of the metal layer 22 is made of a material, which bonds well with the metal layer 14, to function as a reinforcing layer. The glass layer 24 is screen printed on the wall layer 14 and preferably covers a portion of the metal layer 22 for example with a thickness of about 50 to 200 μm. In the meantime, the glass layer 24 is preferably formed at least slightly thicker than the metal layer 22 to cover the metal layer 22 at least in part, with a thickness of about 10 to 20 μm in particular.

The glass layer 24 is made of glass containing $SiO_2$ as its major component to have a high value of insulation resistance. Glass of such type may be selected from those which can be screen printed and fired at a temperature range of about 700 to 900° C. Examples of such glass products may include 5704J and 9615 Glass Encapsulant available from Dupont.

Further, the lid 28 is mounted on the top of the metal layer 22 via a bonding layer 26. The lid 28 functions to protect the electronic components 18 installed within the cavity 16 from the external environment as well as to maintain the cavity 16 at a predetermined vacuum level. The lid 28 is typically made of Kovar. Kovar is an alloy containing Fe 54 wt %, Ni 28 wt % and Co 18 wt %, and has an expansion coefficient substantially same as that of hard glass to strongly adheres with the same. In the meantime, the bonding layer 26 for bonding the lid 28 with the metal layer 22 is made of Au/Sn or the like.

Hereinafter a process of fabricating the ceramic package 10 of the invention will be described.

First, a number of green sheets having physical property and thickness suitable for a desired ceramic package are prepared in Step 1.

In Step 2, the green sheets are divided into three green sheet groups, in which the first group of green sheets form a lower section of the base layer 12 in the ceramic package 10 as shown in FIG. 5, the second group of green sheets form an upper section of the base layer 12 thereof, and the third group of green sheets form the wall layer 14 thereof.

In Step 3, connection patterns, terminals and ground patterns are formed in the green sheet groups. In detail, conductive paste is printed on corresponding ones of the green sheets to form internal connection patterns such as strip lines in the base layer, internal terminals in the wall layer, external terminals (not shown) in the base layer and ground patterns on the underside of the base layer.

Then, the respective sheet groups are perforated to form a plurality of via holes (not shown) therein in Step 4.

In Step 5, the via holes are filled with conductive paste to form a plurality of conductive via patterns in the base layer and the wall layer.

The groups of green sheets are punched in their central portions to form central openings of a predetermined size in Step 6. The central openings formed in the third green sheet group are sized and positioned equal to the cavity 16 of the ceramic package 10 (refer to FIG. 5) as a final product.

The plurality of green sheets are laminated one atop another by the groups and then pressed to form a plurality of structural layers in Step 7. Describing it in more detail, the first group of green sheets are pressed together to form the lower section of the base layer 12, the second group of green sheets are pressed together to form the upper section of the base layer 12, and the third group of green sheets are pressed together to form the wall layer 14. Hereinafter the term 'structural layers' will be used to designate in common the lower section of the base layer 12, the upper section of the base layer 12 and the wall layer 14. Although the green sheet groups may be pressed under the same pressure, it is preferred that the respective green sheet groups are pressed under their own pressures different from one another, which are required for the respective structural layers formed by the respective green sheet groups.

Alternative to the above order of Steps 3 to 7, Step 7 for laminating the sheets may be performed prior to Step 3 for forming the electrodes and metal patterns.

In Step 8, the entire structural layers are stacked on a lower jig (not shown) in the order of the lower section of the base layer, the upper section of the base layer and the wall layer 14 to form a package structure in a shape similar to that of the ceramic package 10 as shown in FIG. 5, so that the openings in the wall layer 14 form the cavity 16 and the associated conductive via patterns are connected together. Then, an upper jig is placed on the wall layer 14.

Then, a predetermined pressure is applied to the upper jig from above to press the structural layers together between the upper and lower jigs in Step 9.

Alternatively, both the lower and upper jigs may be pressed against the structural layers to compress the same simultaneously upward and downward.

Adhesive such as glue may be coated between the structural layers to properly reduce the pressure applied from the jigs thereby preventing the package structure from being undesirably deformed.

In Step 10, metal paste such as Ag is coated on the top of the wall layer 14 of the package structure to form the metal layer 22 around the cavity 16.

Then in Step 11, ceramic glass 24 is coated via screen printing on an interface between the wall layer 14 and the metal layer 22 in such a fashion to cover the metal layer 22 at a predetermined width.

The glass layer 24 preferably covers the metal layer 22 with a with of about 50 to 200 $\mu$m. In the meantime, the glass layer 24 is preferably formed at least slightly thicker than the metal layer 22 to cover the metal layer 22 at least in part, with a thickness of about 10 to 20 $\mu$m in particular.

Glass of this glass layer 24 contains $SiO_2$ as its major component to have a high value of insulation resistance. Glass of such type may be selected from those which can be screen printed and fired at a temperature range of about 700 to 900° C. Examples of such glass products may include 5704J and 9615 Glass Encapsulant available from Dupont.

Then, the package structure is baked out at a temperature of about 330° C. for about 21 hrs and fired at a temperature of about 830° C. for about 30 mins in Step 12.

In Step 13, the package structure is cooled down, and the metal layer 22 is plated by etching the metal layer 22 with 2% HF for about 3 mins, treating the metal layer 22 with Pd for about 5 mins, plating Ni on the metal layer 22 for about 30 mins, and plating Au on the metal layer 22 for about 20 mins.

Then, the electronic components 18 such as IC chips are mounted within the cavity 16 via the metal bumps 20 in Step 14.

Then in Step 15, the lid 28 is attached to the metal layer 22 via the bonding layer 26 to seal the cavity 16 thereby completing the ceramic package 10. In this step, the lid 28 is preferably welded at a temperature of about 330° C. in a nitrogen atmosphere.

Preferably, the bonding layer 26 is made of Au/Sn or the like and the lid 116 is made of Kovar.

Also, the ceramic layer 24 is formed around the metal layer 22 so that the lid 28 can be readily aligned with the metal layer 22 when the lid 28 is attached to the metal layer 22.

Figure 8:
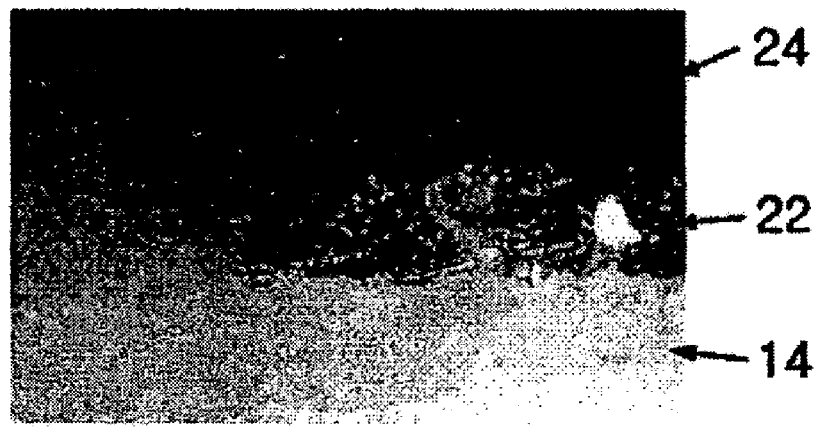
FIG. 8 is a photograph showing a metal layer coupled with an underlying ceramic wall layer in the ceramic package of the invention.

FIG. 8 is a photograph showing the metal layer 22 coupled with the underlying ceramic wall layer 14 in the ceramic package 10 fabricated according to the invention.

Figure 4:
FIG. 4 is a photograph showing that a metal layer is raised from an underlying ceramic wall layer in the ceramic package of the prior art.

As shown in FIG. 8, the metal layer 22 is securely coupled with the ceramic wall layer 14 since it is covered with the glass layer 24 at least in part. As a result, it can be understood that the ceramic package of the invention does not create the crack C formed between the ceramic wall layer 114 and the metal layer 112 in the ceramic package 100 of the prior art (refer to FIG. 4).

According to the present invention as set forth above, the glass layer is coated around the metal layer, which is attached on the ceramic wall layer around the cavity, in order to reinforce the bonding force between the metal layer and the underlying ceramic wall layer, thereby preventing creation of cracks between the metal layer and the underlying ceramic wall layer. Otherwise, as observed in the prior art, leak or introduction of outer air into the cavity through the cracks may undesirably take place to degrade the vacuum level in the cavity of the ceramic package, thereby deteriorating the performance of the electronic components installed in the cavity.

Further, because the ceramic layer is formed around the metal layer, the lid can be readily aligned and thus readily coupled with the metal layer.

Although the invention has been shown and described with reference to the above preferred embodiment, it will be understood by those skilled in the art that various modifications and changes may be made therein without departing from the spirit and scope of the invention as defined by the appended claims.

What is claimed is:

1. A method for fabricating a ceramic package having a cavity, comprising the following steps of:
    applying metal paste on a wall layer of the ceramic package to form a metal layer around the cavity and exposing an outer peripheral portion of the wall layer;
    coating a glass layer on an interface between the outer peripheral portion of the wall layer and the metal layer;
    heat treating the ceramic package;
    plating the metal layer;
    mounting an electronic component within the cavity; and
    attaching a lid on the metal layer to seal the cavity.

2. The method for fabricating a ceramic package according to claim 1, wherein the step of attaching a lid comprises forming a bonding layer on the metal layer to bond the lid with the metal layer via the bonding layer.

3. The method for fabricating a ceramic package according to claim 1, wherein the step of attaching a lid is carried out at a temperature of about 330° C. in a nitrogen atmosphere.

4. The method for fabricating a ceramic package according to claim 1, wherein the step of heat treating comprises baking the ceramic package at a temperature of about 330° C. for about 21 hours and firing the baked ceramic package at a temperature of about 830° C. for about 30 minutes.

5. The method for fabricating a ceramic package according to claim 1, further comprising the step of treating the metal layer with Pd and plating the metal layer with Ni and Au.

6. The method for fabricating a ceramic package according to claim 5, wherein the plating step comprises: etching the metal plate with 2% HF for about 3 minutes, treating the etched metal plate with Pd, plating the Pd-treated metal plate with Ni for about 30 minutes and with Au for about 20 minutes.

* * * * *